United States Patent
Hosotani et al.

(10) Patent No.: US 8,592,928 B2
(45) Date of Patent: Nov. 26, 2013

(54) MAGNETIC RANDOM ACCESS MEMORY AND METHOD OF MANUFACTURING THE SAME

(75) Inventors: Keiji Hosotani, Yokohama (JP); Hiroyuki Kanaya, Yokohama (JP); Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/237,586

(22) Filed: Sep. 20, 2011

(65) Prior Publication Data
US 2012/0068286 A1  Mar. 22, 2012

(30) Foreign Application Priority Data
Sep. 21, 2010  (JP) ................................. 2010-211376

(51) Int. Cl.
*H01L 29/82*  (2006.01)

(52) U.S. Cl.
USPC .... 257/421; 257/295; 257/763; 257/E43.006; 365/158

(58) Field of Classification Search
USPC ................................. 257/421, 295; 356/158
See application file for complete search history.

(56) References Cited

U.S. PATENT DOCUMENTS

| | | | |
|---|---|---|---|
| 7,068,536 B2 | 6/2006 | Matsutera et al. | |
| 7,605,420 B2 * | 10/2009 | Furuta et al. | 257/314 |
| 2007/0246832 A1 * | 10/2007 | Odagawa et al. | 257/763 |
| 2011/0155988 A1 * | 6/2011 | Ohba et al. | 257/2 |

FOREIGN PATENT DOCUMENTS

| | | |
|---|---|---|
| JP | 2004-153070 A | 5/2004 |
| JP | 2005-019457 A | 1/2005 |
| JP | 2010-103224 A | 5/2010 |
| JP | 2010-186869 A | 8/2010 |

OTHER PUBLICATIONS

Japanese Office Action dated Jan. 29, 2013 of corresponding Japanese Patent Application No. 2010-211376.
Oh, et al. "On-axis scheme and Novel MTJ structure for sub-30nm Gb density STT-MRAM." 12.6.1 pp. 300-303 (2010).
U.S. Appl. No. 12/559,446, filed Sep. 14, 2009, Hosotani et al.

* cited by examiner

*Primary Examiner* — Matthew W Such
*Assistant Examiner* — Frederick B Hargrove
(74) *Attorney, Agent, or Firm* — Knobbe, Martens, Olson & Bear, LLP

(57) ABSTRACT

According to one embodiment, a magnetic random access memory includes a selection element formed on a semiconductor substrate, an interlayer dielectric film formed above the selection element, a contact layer formed in the interlayer dielectric film, and electrically connected to the selection element, a lower electrode layer made of a metal material, and electrically connected to the contact layer, a metal oxide insulating film made of an oxide of the metal material, and surrounding a side surface of the lower electrode layer, a magnetoresistive element formed on the lower electrode layer, an upper electrode layer formed on the magnetoresistive element, a sidewall insulating film formed on a side surface of the magnetoresistive element and a side surface of the upper electrode layer, and a bit line electrically connected to the upper electrode layer.

6 Claims, 6 Drawing Sheets

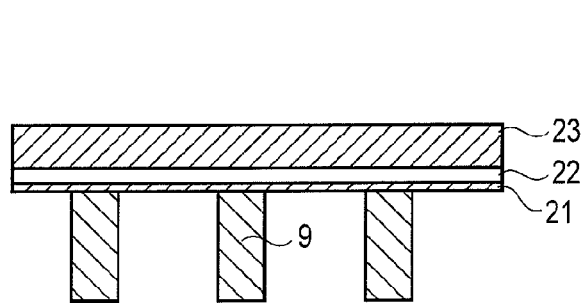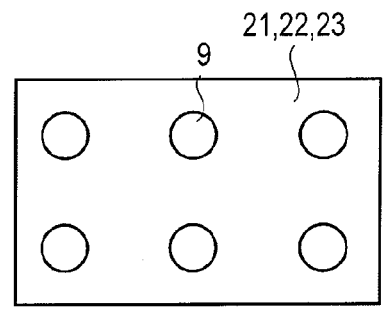
FIG. 4A　　　　　　　　FIG. 4B
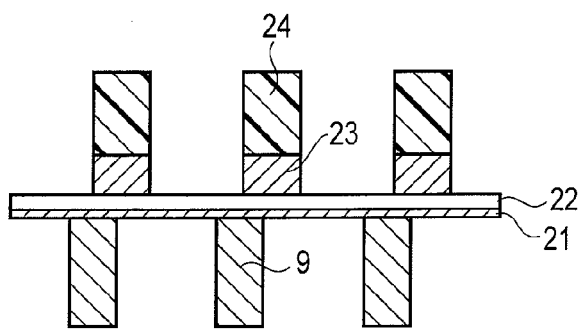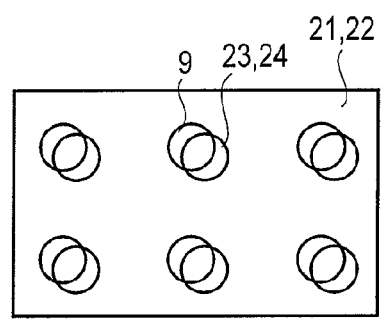
FIG. 5A　　　　　　　　FIG. 5B
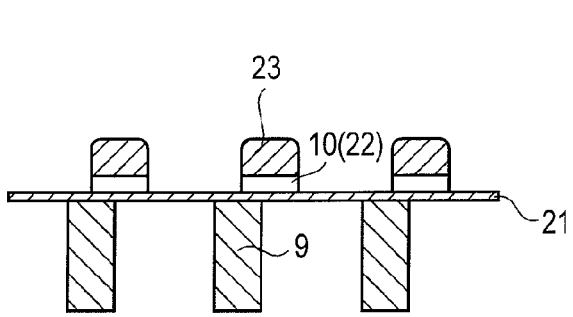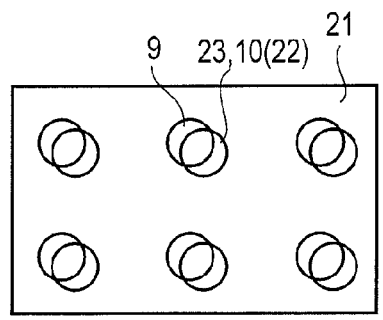
FIG. 6A　　　　　　　　FIG. 6B

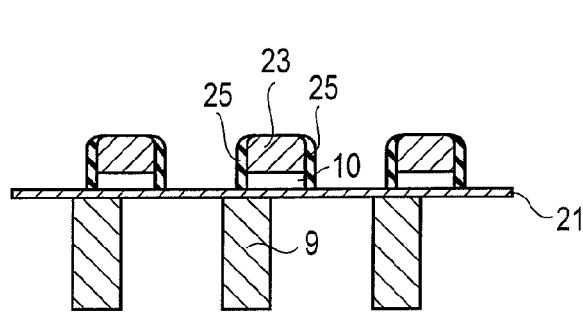 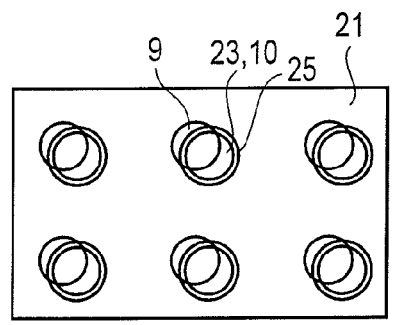
FIG. 7A　　　　　FIG. 7B
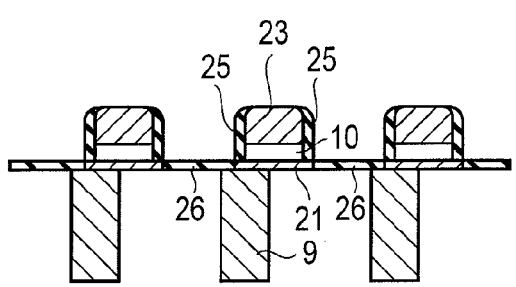 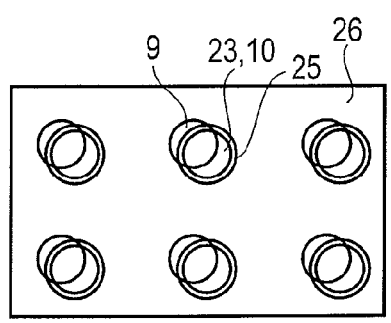
FIG. 8A　　　　　FIG. 8B
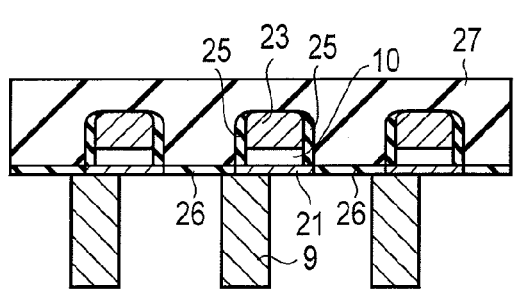 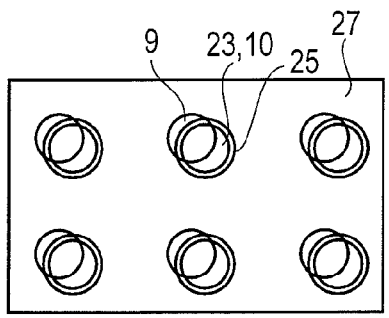
FIG. 9A　　　　　FIG. 9B

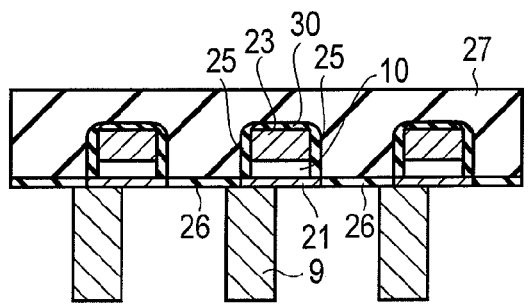
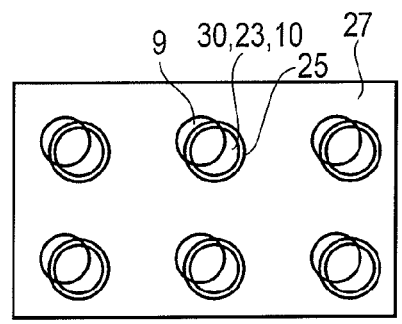
F I G. 13A                F I G. 13B
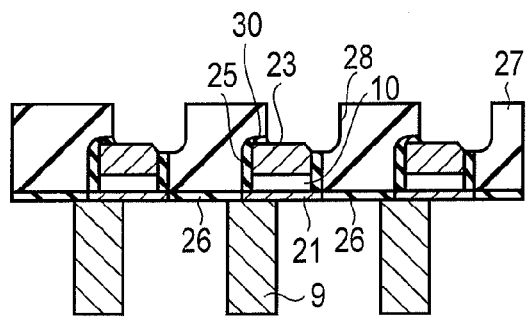
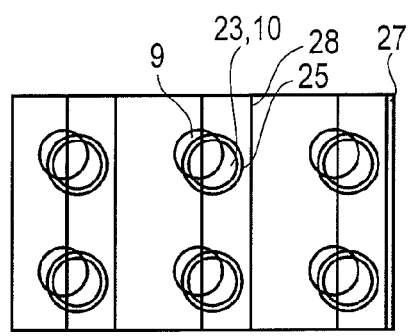
F I G. 14A                F I G. 14B
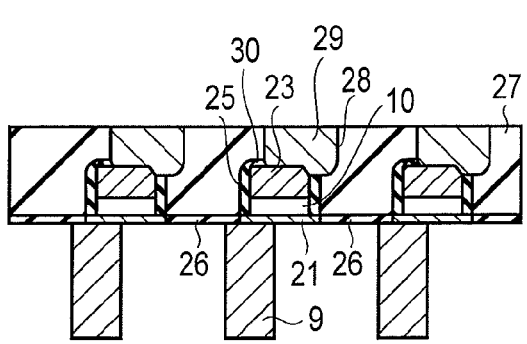
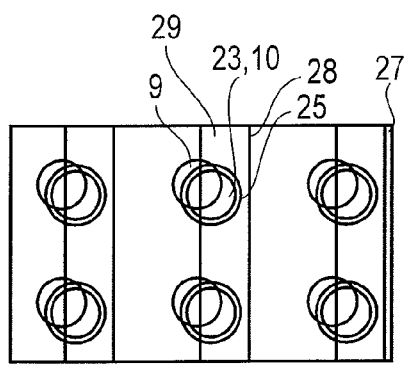
F I G. 15A                F I G. 15B

MAGNETIC RANDOM ACCESS MEMORY AND METHOD OF MANUFACTURING THE SAME

CROSS-REFERENCE TO RELATED APPLICATIONS

This application is based upon and claims the benefit of priority from prior Japanese Patent Application No. 2010-211376, filed Sep. 21, 2010, the entire contents of which are incorporated herein by reference.

FIELD

Embodiments described herein relate generally to a magnetic random access memory and a method of manufacturing the same.

BACKGROUND

Research for putting a magnetic random access memory (MRAM) using the magnetoresistive effect (TMR: Tunneling Magneto Resistive) into practical use is being extensively made all over the world. Among other MRAMs, a spin transfer torque MRAM using the physics of spin transfer torque magnetization reversal is expected as a technique that will realize a large-scale non-volatile random access memory.

Unfortunately, the spin transfer torque MRAM has several serious technical problems. One problem is the processing of a magnetic tunnel junction film (MTJ film) having a multi-layered film including a metal and metal oxide.

An MTJ film processing method according to a first prior art will be explained below. In this method, a lower electrode layer, MTJ film, and upper electrode layer are sequentially stacked after a lower contact layer to be connected to a switching element is formed. After that, a photoresist mask is formed on the upper electrode layer, and a photoresist pattern is transferred onto the upper electrode layer by etching. Then, the MTJ film is processed using etching. Since this processing of the MTJ film uses a method including physical etching, it is difficult to increase the etching selectivity to the material of, e.g., a lower silicon oxide film (an interlayer dielectric film around the lower contact layer), so there is the possibility that the lower layer is largely etched during overetching. When processing the MTJ film, therefore, the lower electrode layer is normally used as an etching stopper layer. After that, it is necessary to separately process the lower electrode layer again by using lithography and dry etching.

An MTJ film processing method according to a second prior art will now be explained. In this method, a pattern is transferred onto an upper electrode layer after a photoresist mask is formed in the same manner as in the above-mentioned first prior art. Then, an MTJ film and lower electrode layer are simultaneously etched by using the upper electrode layer. This etching is stopped when a lower interlayer dielectric film is exposed.

The problem of the first prior art is as follows. In the first prior art, the MTJ film and lower electrode layer are processed by using different lithography techniques. This makes it necessary to give a design margin between the MTJ and lower electrode layer, and relax the design of the whole cell to some extent. Accordingly, the cell is difficult to downsize.

The problems of the second prior art are as follows. In the second prior art, the MTJ film and lower electrode layer are simultaneously processed without using the lower electrode layer as an etching stopper layer. This processing of the MTJ film includes physical etching. Therefore, the lower interlayer dielectric film is largely etched back during overetching after the interlayer dielectric film is exposed. To prevent this, the lower interlayer dielectric film must be thickened. This interferes with the downsizing of the lower contact layer. In addition, when forming the MTJ and lower contact layer by close-packed design, the lower contact layer exposed by misalignment is etched away to a certain degree. Consequently, the reliability of the contact decreases. Giving a design margin between the lower contact layer and MTJ in order to avoid this problem also interferes with the downsizing of the cell.

As explained in the problems of the above-mentioned first and second prior arts, it is difficult for the conventional MTJ processing techniques to downsize a cell.

BRIEF DESCRIPTION OF THE DRAWINGS

FIGS. 4A and 4B are a sectional view and a plan view, respectively, showing a manufacturing step, which follows FIGS. 3A and 3B, of the first manufacturing method of the magnetic random access memory according to the embodiment;

FIGS. 5A and 5B are a sectional view and a plan view, respectively, showing a manufacturing step, which follows FIGS. 4A and 4B, of the first manufacturing method of the magnetic random access memory according to the embodiment;

FIGS. 6A and 6B are a sectional view and a plan view, respectively, showing a manufacturing step, which follows FIGS. 5A and 5B, of the first manufacturing method of the magnetic random access memory according to the embodiment;

FIGS. 7A and 7B are a sectional view and a plan view, respectively, showing a manufacturing step, which follows FIGS. 6A and 6B, of the first manufacturing method of the magnetic random access memory according to the embodiment;

FIGS. 8A and 8B are a sectional view and a plan view, respectively, showing a manufacturing step, which follows FIGS. 7A and 7B, of the first manufacturing method of the magnetic random access memory according to the embodiment;

FIGS. 9A and 9B are a sectional view and a plan view, respectively, showing a manufacturing step, which follows FIGS. 8A and 8B, of the first manufacturing method of the magnetic random access memory according to the embodiment;

FIGS. 13A and 13B are a sectional view and a plan view, respectively, showing a manufacturing step, which follows FIGS. 12A and 12B, of the second manufacturing method of the magnetic random access memory according to the embodiment;

FIGS. 14A and 14B are a sectional view and a plan view, respectively, showing a manufacturing step, which follows FIGS. 13A and 13B, of the second manufacturing method of the magnetic random access memory according to the embodiment; and FIGS. 15A and 15B are a sectional view and a plan view, respectively, showing a manufacturing step, which follows FIGS. 14A and 14B, of the second manufacturing method of the magnetic random access memory according to the embodiment.

DETAILED DESCRIPTION

Figure 1:
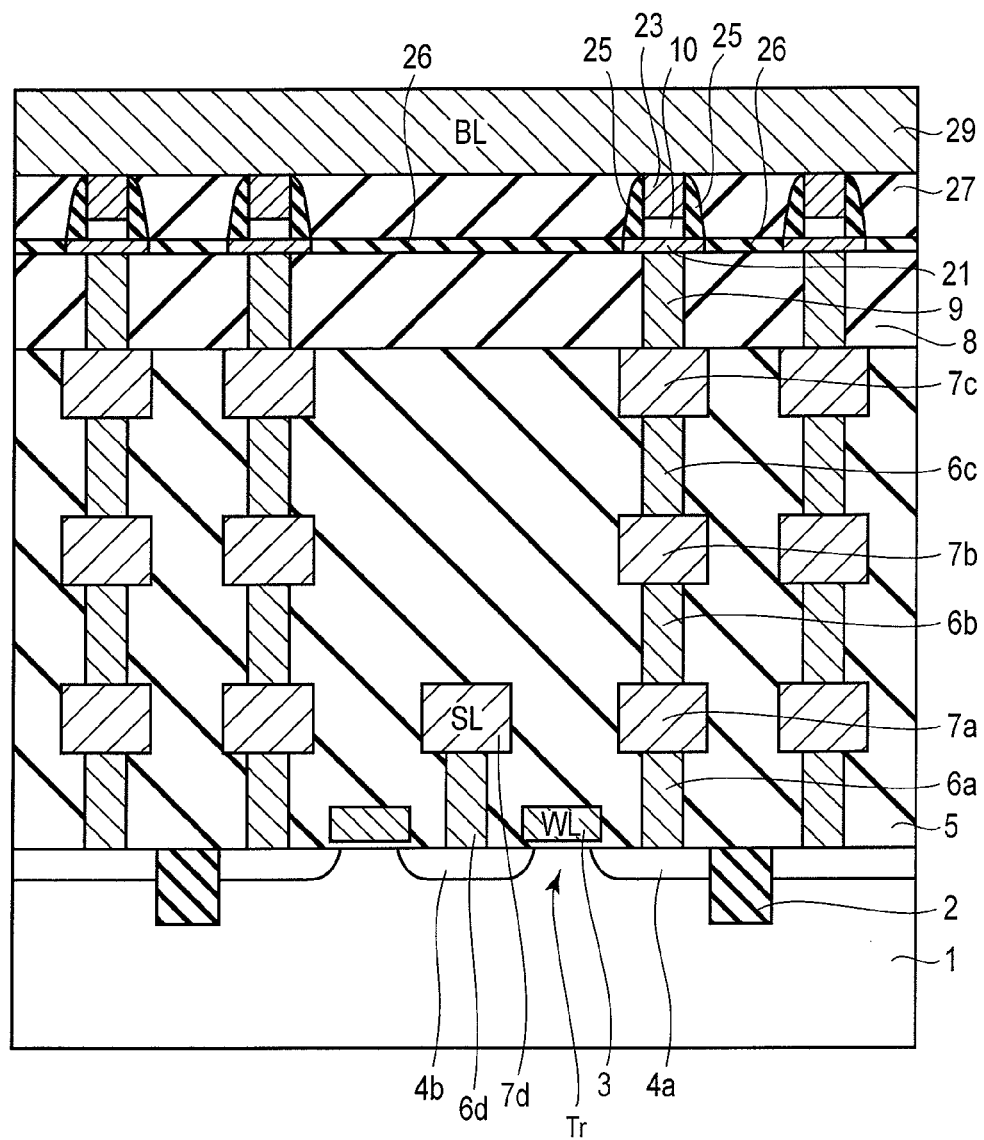
FIG. 1 is a sectional view showing a magnetic random access memory according to an embodiment.

In general, according to one embodiment, a magnetic random access memory includes a selection element formed on a semiconductor substrate, an interlayer dielectric film formed above the selection element, a contact layer formed in the interlayer dielectric film, and electrically connected to the selection element, a lower electrode layer made of a metal material, and electrically connected to the contact layer, a metal oxide insulating film made of an oxide of the metal material, and surrounding a side surface of the lower electrode layer, a magnetoresistive element formed on the lower electrode layer, an upper electrode layer formed on the magnetoresistive element, a sidewall insulating film formed on a side surface of the magnetoresistive element and a side surface of the upper electrode layer, and a bit line electrically connected to the upper electrode layer.

The embodiment will be explained below with reference to the accompanying drawings. In the following explanation, the same reference numerals denote the same portions throughout the drawings.

[1] Structure

The structure of a memory cell of a magnetic random access memory according to the embodiment will be explained below with reference to FIGS. 1 and 2.

As shown in FIG. 1, element isolation regions 2 having an STI (Shallow Trench Isolation) structure for isolating element regions are formed in a semiconductor substrate 1. Gate electrodes (word lines) 3 are formed on the semiconductor substrate 1. Source/drain diffusion layers 4a and 4b are formed in the semiconductor substrate 1 on the two sides of each gate electrode 3. Thus, a transistor Tr as a selection switching element for a memory cell is formed.

Contact layers 6a, 6b, 6c, and 6d and multilayered interconnection layers 7a, 7b, 7c, and 7d are formed in an interlayer dielectric film 5 on the semiconductor substrate 1. The contact layers 6a, 6b, and 6c and multilayered interconnection layers 7a, 7b, and 7c are connected to the source/drain diffusions layer 4a, and the contact layer 6d and multilayered interconnection layer 7d are connected to the source/drain diffusion layer 4b. The interconnection layer 7d functions as a source line SL. Adjacent cells share the source line SL.

An interlayer dielectric film 8 is formed on the uppermost interconnections 7c, and contact layers 9 are formed in the interlayer dielectric film 8. Each contact layer 9 is connected to the transistor Tr via the contact layers 6a, 6b, and 6c and multilayered interconnection layer 7a, 7b, and 7c. A lower electrode layer 21, MTJ element 10, and upper electrode layer 23 are sequentially stacked on each contact layer 9. A metal oxide insulating film 26 is formed around the lower electrode layers 21. Sidewall insulating films 25 are formed on the side surfaces of the MTJ element 10 and upper electrode layer 23. The MTJ element 10 is connected to a bit line (BL) 29 via the upper electrode layer 23. Note that the bit line BL and source line SL need not run in different directions (directions perpendicular to each other) as shown in FIG. 1, and may also run in the same direction.

Figure 2:
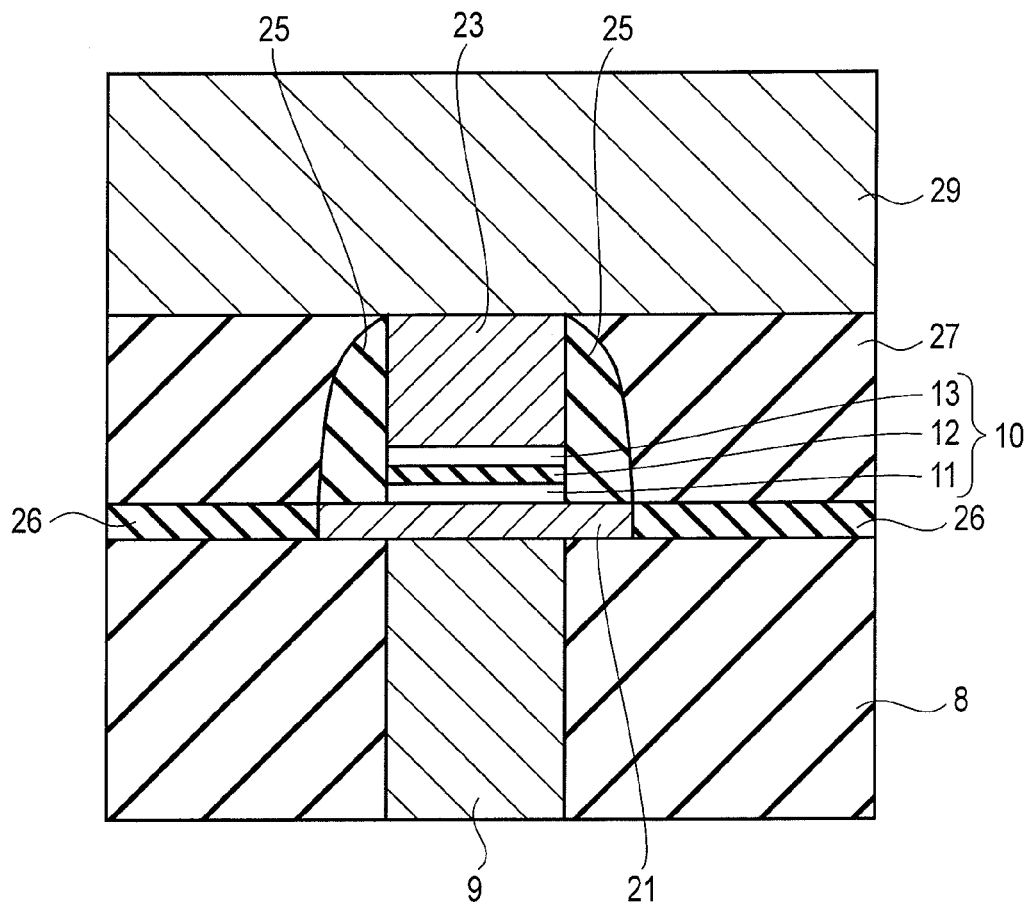
FIG. 2 is a sectional view showing the periphery of an MTJ element of the magnetic random access memory according to the embodiment.

As shown in FIG. 2, the MTJ element 10 includes a fixed layer 11, a recording layer 13, and a tunnel junction layer 12 formed between the fixed layer 11 and recording layer 13. Note that the MTJ element 10 is not limited to the structure shown in FIG. 2, and may also have a structure in which each of the fixed layer 11, tunnel junction layer 12, and recording layer 13 is a multilayered film, or a double-junction structure.

The metal oxide insulating film 26 is formed by oxidizing portions of the lower electrode layer 21 (portions of the lower electrode layer 21 exposed from the MTJ element 10 and sidewall insulating films 25). Therefore, the metal oxide insulating film 26 is made of an oxide of a metal material forming the lower electrode layer 21. The material of the lower electrode layer 21 is a material that forms an insulating substance when oxidized, e.g., Ta, Fe, Al, or Cu. In this case, the metal oxide insulating film 26 is made of an oxide of, e.g., Ta, Fe, Al, or Cu.

Examples of the material of the upper electrode layer 23 are as follows. In Example 1, a material having a high oxidation resistance (e.g., Pt or Au) is preferably used as the upper electrode layer 23. In Example 2, a metal material (e.g., Ru, Re, or W) that does not lose its conductivity even when oxidized may be used as the upper electrode layer 23. In Example 3, a metal material (e.g., Ti or Sn) that changes into a semiconductor when oxidized may be used as the upper electrode layer 23. In Example 3, the upper electrode layer 23 can also be used as an oxidation-resistant protective layer and contact layer in the upper portion by thinning the film made of the above-mentioned material. In Example 4, a material (e.g., W) that changes into an insulator when oxidized but is easily removable by a later removing process (e.g., RIE or wet etching) may be used as the upper electrode layer 23.

When selecting the materials of the upper electrode layer 23 and lower electrode layer 21, it is desirable to select different materials as the upper electrode layer 23 and lower electrode layer 21.

Examples of the material of the sidewall insulating films 25 are a silicon nitride film (SiN) and alumina ($Al_2O_3$). Examples of the material of the interlayer dielectric films 8 and 27 are a silicon oxide film ($SiO_2$) and silicon nitride film (SiN). The materials of the sidewall insulating films 25 and interlayer dielectric films 8 and 27 are different from the material of the metal oxide insulating film 26.

The film thickness of the metal oxide insulating film 26 is the same as that of the lower electrode layer 21. The metal oxide insulating film 26 has an upper surface leveled with that of the lower electrode layer 21, and a bottom surface leveled with that of the lower electrode layer 21. Note that the film thickness of the metal oxide insulating film 26 is sometimes larger or smaller than that of the lower electrode layer 21 due to the influence of the process of oxidizing the lower electrode layer 21. In this case, the upper and bottom surfaces of the metal oxide insulating film 26 and lower electrode layer 21 may respectively be on slightly different levels.

The metal oxide insulating film 26 surrounds all the side surfaces of the lower electrode layer 21. All the side surfaces of the lower electrode layer 21 are in direct contact with the side surfaces of the metal oxide insulating film 26.

The side surfaces of the lower electrode layer 21 extend outside the side surfaces of the MTJ element 10, and are aligned with the outer side surfaces of the sidewall insulating films 25. Note that the side surfaces of the lower electrode layer 21 may also be recessed inside or extend outside the outer side surfaces of the sidewall insulating films 25, depending on the progress of oxidation of the lower electrode layer 21. The side surfaces of the MTJ element 10 are aligned with those of the upper electrode layer 23.

[2] Manufacturing Method

[2-1] First Manufacturing Method

The first manufacturing method of the magnetic random access memory of this embodiment will be explained below with reference to FIGS. 3A, 3B, 4A, 4B, 5A, 5B, 6A, 6B, 7A, 7B, 8A, 8B, 9A, 9B, 10A, 10B, 11A, and 11B. Note that FIGS. 3A, 4A, 5A, 6A, 7A, 8A, 9A, 10A, and 11A show sections different by 90° from those shown in FIGS. 1 and 2.

Figures 3A, 3B:
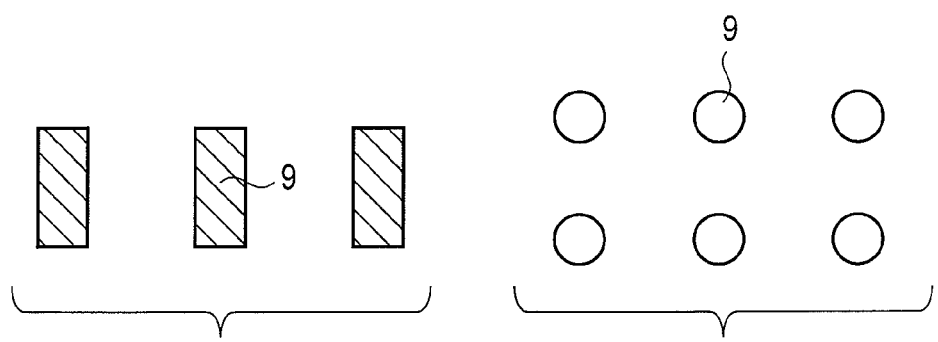
FIGS. 3A and 3B are a sectional view and a plan view, respectively, showing a manufacturing step of the first manufacturing method of the magnetic random access memory according to the embodiment.

First, as shown in FIGS. 3A and 3B, after transistors (not shown) as switching elements and multilayered interconnection layers (not shown) are formed in a semiconductor substrate (not shown), a planarized interlayer dielectric film (not shown) is formed, and contact layers 9 are formed in this interlayer dielectric film. More specifically, contact holes are formed in the interlayer dielectric film, a barrier metal film made of, e.g., or TiN is formed in each contact hole, and a metal material such as W is buried on this barrier metal film. After that, the metal material and barrier metal film are planarized until the upper surface of the interlayer dielectric film is exposed. Thus, the contact layers 9 to be electrically connected to the switching elements via the multilayered interconnection layers are formed.

Then, as shown in FIGS. 4A and 4B, a lower electrode layer 21, MTJ film (magnetoresistive film) 22, and upper electrode layer 23 are sequentially formed on the contact layers 9 and interlayer dielectric film by using a technique such as sputtering. The lower electrode layer 21 is in electrical contact with the upper surfaces of the contact layers 9.

As the lower electrode layer 21, it is possible to use a material that changes into an insulating substance when oxidized, e.g., Ta, Fe, Al, or Cu. The film thickness of the lower electrode layer 21 is desirably 5 to 20 nm. This film thickness can allow the lower electrode layer 21 to function as an etching stopper layer, and prevent an unoxidized region from remaining in the lower electrode layer 21 at the same time.

As the upper electrode layer 23, it is possible to use a material having a high oxidation resistance, e.g., Pt or Au, a material that does not lose its conductivity even when oxidized, e.g., Ru, Re, or W, or a material that changes into a semiconductor when oxidized, e.g., Ti or Sn.

Subsequently, as shown in FIGS. 5A and 5B, a photoresist mask 24 is formed on the upper electrode layer 23 and patterned by using photolithography. The patterns of the patterned photoresist masks 24 are transferred onto the upper electrode layer 23 by using etching. After that, the remaining photoresist masks 24 are removed.

As shown in FIGS. 6A and 6B, the MTJ film 22 is processed by using the upper electrode layers 23 as masks, thereby forming MTJ elements 10 divided into cells. Since a method including physical etching is used when processing the MTJ film 22, it is difficult to increase the etching selectivity to the material, e.g., a silicon oxide film, of the lower layer (an interlayer dielectric film 8), so there is the possibility that the lower layer is largely etched during overetching. Therefore, the lower electrode layer 21 is used as an etching stopper layer when processing the MTJ film 22.

As shown in FIGS. 7A and 7B, sidewall insulating films 25 are formed on the side surfaces of each MTJ element 10 in order to protect these side surfaces. More specifically, a sidewall insulating film 25 such as an SiN film is formed on the upper electrode layers 23 and lower electrode layer 21. After that, the SiN film existing in portions other than the side surfaces of the MTJ elements 10 is etched away by using RIE (Reactive Ion Etching), so that the SiN films remain on only the side surfaces of the MTJ elements 10. Consequently, the upper surface of the lower electrode layer 21 and the upper surface of the upper electrode layer 23 between adjacent MTJ elements 10 are exposed.

Then, as shown in FIGS. 8A and 8B, annealing is performed in an oxidizing ambient. In this step, the exposed lower electrode layer 21 is completely oxidized and changed into an insulating material. As a consequence, a metal oxide insulating film 26 made of the oxidized lower electrode layer 21 is formed between adjacent MTJ elements 10.

As shown in FIGS. 9A and 9B, an interlayer dielectric film 27 is formed so as to cover the MTJ elements 10 by using a material such as TEOS (a silicon oxide film) suited to plasma CVD (Chemical Vapor Deposition). After that, the interlayer dielectric film 27 is planarized by using a method such as CMP (Chemical Mechanical Polish).

Figure 10A:
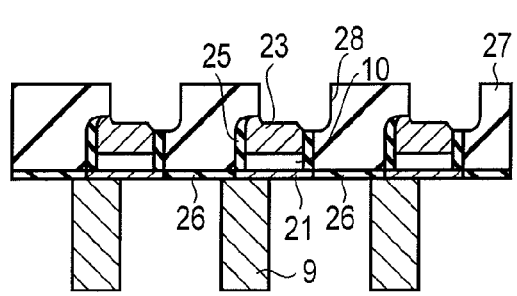
FIGS. 10A and 10B are a sectional view and a plan view, respectively, showing a manufacturing step, which follows FIGS. 9A and 9B, of the first manufacturing method of the magnetic random access memory according to the embodiment.
Figure 10B:
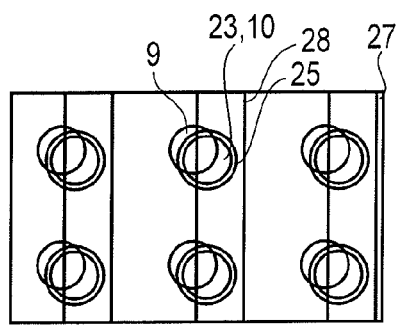

Subsequently, as shown in FIGS. 10A and 10B, a photoresist mask (not shown) is formed on the interlayer dielectric film 27 by using lithography, and the interlayer dielectric film 27 in bit line formation regions is etched away by, e.g., 2,000 to 4,000 Å. In this step, bit line trenches 28 are formed, and the upper electrode layers 23 are partially exposed.

Figure 11A:
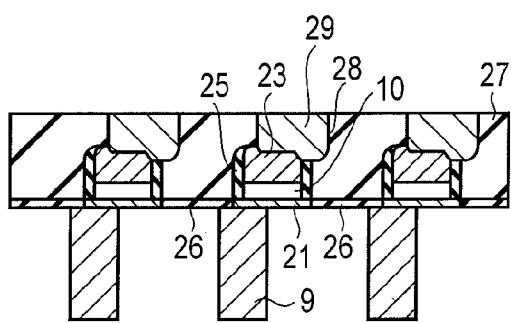
FIGS. 11A and 11B are a sectional view and a plan view, respectively, showing a manufacturing step, which follows FIGS. 10A and 10B, of the first manufacturing method of the magnetic random access memory according to the embodiment.
Figure 11B:
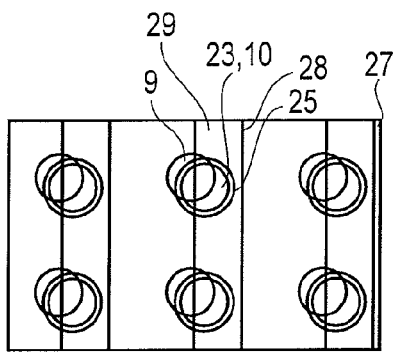

As shown in FIGS. 11A and 11B, a barrier metal film (not shown) made of, e.g., Ti or Ta is deposited in each trench 28, and an interconnection material such as Cu is buried by using plating. After that, the barrier metal film and interconnection material formed in portions other than the trenches 28 are etched away by CMP or the like, thereby forming bit lines 29 in the trenches 28.

[2-2] Second Manufacturing Method

The second manufacturing method of the magnetic random access memory of this embodiment will be explained below with reference to FIGS. 12A, 12B, 13A, 13B, 14A, 14B, 15A, and 15B. Note that FIGS. 12A, 13A, 14A, and 15A show sections different by 90° from those shown in FIGS. 1 and 2.

First, MTJ elements 10 divided into cells are formed and sidewall insulating films 25 are formed on the side surfaces of the MTJ elements 10 following the same procedures as in the above-described first manufacturing method (see FIGS. 4A, 4B, 5A, 5B, 6A, 6B, 7A, and 7B).

In the second manufacturing method, a material (e.g., W) that changes into an insulator when oxidized but is easily removable by a later removing process (e.g., RIE or wet etching) is used as upper electrode layers 23.

Figure 12A:
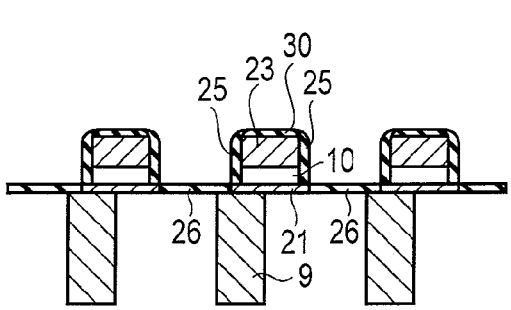
FIGS. 12A and 12B are a sectional view and a plan view, respectively, showing a manufacturing step of the second manufacturing method of the magnetic random access memory according to the embodiment.
Figure 12B:
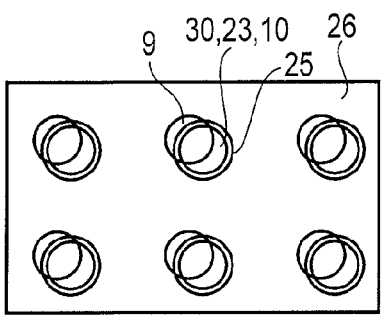

Then, as shown in FIGS. 12A and 12B, annealing is performed in an oxidizing ambient. In this step, an exposed lower electrode layer 21 is completely oxidized and changed into an insulating material. As a consequence, a metal oxide insulating film 26 made of the oxidized lower electrode layer 21 is formed between adjacent MTJ elements 10. In addition, the exposed upper surfaces of the upper electrode layers 23 are oxidized to form oxide films 30 on the upper surfaces of the upper electrode layers 23.

As shown in FIGS. 13A and 13B, an interlayer dielectric film 27 is formed so as to cover the MTJ elements 10 by using a material such as TEOS (a silicon oxide film) suited to plasma CVD. After that, the interlayer dielectric film 27 is planarized by using a method such as CMP.

Subsequently, as shown in FIGS. 14A and 14B, a photoresist mask (not shown) is formed on the interlayer dielectric film 27 by using lithography, and the interlayer dielectric film 27 in bit line formation regions is etched away by, e.g., 2,000 to 4,000 Å. Consequently, bit line trenches 28 are formed, and the upper electrode layers 23 are partially exposed. In this step, the oxide films 30 on the upper electrode layers 23 are also removed by the etching when forming the trenches 28.

As shown in FIGS. 15A and 15B, a barrier metal film (not shown) made of, e.g., Ti or Ta is deposited in each trench 28, and an interconnection material such as Cu is buried by using plating. After that, the barrier metal film and interconnection material formed in portions other than the trenches 28 are etched away by CMP or the like, thereby forming bit lines 29 in the trenches 28.

[3] Materials of MTJ Element

The MTJ element according to this embodiment is made of materials to be described below.

[3-1] In-Plane Magnetization Type Element

An in-plane magnetization type MTJ element 10 is formed by using, e.g., the following materials.

Favorable examples of the materials of the fixed layer 11 and recording layer 13 are Fe, Co, Ni, and their alloys, magnetite having a high spin polarization ratio, oxides such as $CrO_2$ and $RXMnO_{3-y}$ (R; rare-earth element, X; Ca, Ba, and Sr), and Heusler alloys such as NiMnSb and PtMnSb. These magnetic materials can more or less contain nonmagnetic elements such as Ag, Cu, Au, Al, Mg, Si, Bi, Ta, B, C, O, N, Pd, Pt, Zr, Ir, W, Mo, and Nb, provided that the materials do not lose ferromagnetism.

As the material of an antiferromagnetic layer forming a part of the fixed layer 11, it is preferable to use, e.g., Fe—Mn, Pt—Mn, Pt—Cr—Mn, Ni—Mn, Ir—Mn, NiO, or $Fe_2O_3$.

As the tunnel junction layer 12 of a spin transfer torque MTJ element 10, it is desirable to use a tunnel barrier having the coherent tunneling effect and formed by, e.g., annealing magnesium oxide (MgO) or a stack of magnesium (Mg) and magnesium oxide (MgO). It is also possible to use various dielectrics such as $Al_2O_3$, $SiO_2$, AlN, $Bi_2O_3$, $MgF_2$, $CaF_2$, $SrTiO_2$, and $AlLaO_3$. These dielectrics may have oxygen, nitrogen, and fluorine deficiencies.

[3-2] Perpendicular Magnetization Type Element

A perpendicular magnetization type MTJ element 10 is formed by using, e.g., the following materials. Note that the tunnel junction layer 12 is the same as that of the in-plane magnetization type element.

[A] A magnetic material having a high coercive force is made of a material having a high magnetic anisotropic energy density of $1\times10^6$ erg/cc or more.

Examples of the material will be explained below.

EXAMPLE 1

"A material made of an alloy containing at least one of Fe (iron), Co (cobalt), and Ni (nickel) and at least one of Cr (chromium), Pt (platinum), and Pd (palladium)"

Examples of an ordered alloy are Fe(50)Pt(50), Fe(50)Pd (50), and Co(50)Pt(50). Examples of a random alloy are a CoCr alloy, CoPt alloy, CoCrPt alloy, CoCrPtTa alloy, and CoCrNb alloy.

EXAMPLE 2

"A material having a structure in which at least one of Fe, Co, and Ni or an alloy containing one of these elements and one of Pd and Pt or an alloy containing one of these elements are alternately stacked"

Examples are a Co/Pt artificial lattice, Co/Pd artificial lattice, and CoCr/Pt artificial lattice. When using the Co/Pt artificial lattice or Co/Pd artificial lattice, a high resistance change ratio (MR ratio) of about 40% can be realized.

EXAMPLE 3

"An amorphous alloy containing at least one rare-earth metal such as Tb (terbium), Dy (dysprosium), or Gd (gadolinium), and at least one transition metal"

Examples are TbFe, TbCo, TbFeCo, DyTbFeCo, and GdTbCo.

[B] The recording layer 13 can also be made of the magnetic material having a high coercive force as described above. Furthermore, the recording layer 13 may also be made of a magnetic material having a magnetic anisotropic energy density lower than that of the magnetic material having a high coercive force as described above, by adjusting the composition ratio, adding an impurity, or adjusting the thickness.

Examples of the material will be explained below.

EXAMPLE 1

"A material obtained by adding an impurity to an alloy containing at least one of Fe, Co, and Ni and at least one of Cr, Pt, and Pd"

An example of an ordered alloy is a material obtained by decreasing the magnetic anisotropic energy density by adding an impurity such as Cu, Cr, or Ag to Fe(50)Pt(50), Fe(50)Pd (50), or Co(50)Pt(50). An example of a random alloy is a material obtained by decreasing the magnetic anisotropic energy density by increasing the ratio of a nonmagnetic element in a CoCr alloy, CoPt alloy, CoCrPt alloy, CoCrPtTa alloy, or CoCrNb alloy.

EXAMPLE 2

"A material having a structure in which at least one of Fe, Co, and Ni or an alloy containing one of these elements and one of Pd and Pt or an alloy containing one of these elements are alternately stacked, and the thickness of the layer made of the former element or alloy or the thickness of the layer made of the latter element or alloy is adjusted"

The thickness of the layer made of at least one of Fe, Co, and Ni or an alloy containing one of these elements has an optimum value, and the thickness of the layer made of one of Pd and Pt or an alloy containing one of these elements has an optimum value. As the thicknesses deviate from these optimum values, the magnetic anisotropic energy density decreases.

EXAMPLE 3

"A material obtained by adjusting the composition ratio of an amorphous alloy containing at least one rare-earth metal such as Tb (terbium), Dy (dysprosium), or Gd (gadolinium), and at least one transition metal"

An example is a material obtained by decreasing the magnetic anisotropic energy density by adjusting the composition ratio of an amorphous alloy such as TbFe, TbCo, TbFeCo, DyTbFeCo, or GdTbCo.

When using, e.g., a Co/Pt artificial lattice as the recording layer 13, the coercive force of the MTJ element 10 can be controlled by adjusting the thicknesses of Co and Pt.

When using an ordered alloy such as FePt or CoPt as the fixed layer 11, the fct(001) plane is preferably oriented in order to generate perpendicular magnetic anisotropy. For this purpose, it is favorable to use an ultra thin underlayer made of MgO about a few nm thick as a crystal orientation control layer. Instead of MgO, it is also possible to use an element or compound having the fcc structure or bcc structure whose lattice constant is about 2.8, 4.0, or 5.6 Å. Examples are Pt, Pd, Ag, Au, Al, Cu, Cr, Fe, and their alloys. In a bottom-pin structure, the crystal orientation control layer need only be formed between a yoke material and the fixed layer 11. A buffer layer made of, e.g., Ta, TiN, or TaN may also be formed between the crystal orientation control layer and yoke material. In a top-pin structure, fcc(100)-oriented MgO is preferably used as the tunnel junction layer 12. In this case, the above-described crystal orientation control layer may further be stacked as long as the MR ratio does not decrease.

It is similarly favorable to orient the fct(001) plane when using an ordered alloy such as FePt or CoPt as the recording layer 13. In a top-pin (bottom-free) structure, the crystal orientation control layer need only be formed between a yoke material and the fixed layer 11. A buffer layer made of, e.g., Ta, TiN, or TaN may also be formed between the crystal orientation control layer and yoke material. In a bottom-pin (top-free) structure, fcc(100)-oriented MgO is preferably used as the tunnel junction layer 12. In this case, the above-described crystal orientation control layer may further be stacked as long as the MR ratio does not decrease.

Furthermore, to improve the perpendicular magnetism of the fixed layer 11 and recording layer 13, soft magnetic layers made of, e.g., CoFeB or Fe can be inserted between the fixed layer 11 and tunnel junction layer 12 and between the recording layer 13 and tunnel junction layer 12. For example, the tunnel junction layer 12 is given a CoFeB(001)/MgO(001)/CoFeB(001) structure in which a (001)-oriented polycrystalline MgO layer is sandwiched between (001)-oriented polycrystalline CoFeB layers. This effectively improves the function, called coherent tunneling, of a spin filter that selectively transmits only Δ1 electrons (like s-electrons). This greatly helps improve the TMR effect and increase the spin transfer torque efficiency.

[4] Write Operation

In a write operation of this embodiment, spin transfer torque write using the principle of "spin transfer torque magnetization reversal" is performed.

To change an antiparallel state into a parallel state, electrons having spins in the same direction as that of the fixed layer 11 are injected into the recording layer 13 having spins in the opposite direction from the fixed layer 11. In this case, magnetization reversal of the whole recording layer 13 occurs and the MTJ element 10 is set in the parallel state when a current density $J_{cP \to AP}$ is exceeded.

On the other hand, to change the parallel state into the antiparallel state, electrons having the same direction as that of the fixed layer 11 are injected into it from the recording layer 13. That is, electrons having spins in the direction opposite to that of the spins of electrons in the recording layer 13 are injected into it by spin reflection. In this case, magnetization reversal of the whole recording layer 13 occurs and the MTJ element 10 is set in the antiparallel state when a current density $J_{cAP \to P}$ is exceeded.

In the method of spin transfer torque magnetization reversal as described above, the current densities $J_{cP \to AP}$ and $J_{cAP \to P}$ required for magnetization reversal are determined by the types, anisotropies, film thicknesses, and the like of the materials forming the fixed layer 11 and recording layer 13. Therefore, as the element size decreases, a total current value necessary for the write operation reduces. This makes the method suitable for micropatterning.

Also, in a spin transfer type magnetic random access memory, an electric current is perpendicularly supplied to the MTJ element 10, and magnetization reversal occurs because spins are transferred to the recording layer 13 in accordance with the direction. A perpendicular magnetization type memory need only be given uniaxial anisotropy in the direction perpendicular to the film surface, and need not be given magnetic shape anisotropy in the direction of a plane unlike in an in-plane magnetization type (planar magnetization type) memory. Accordingly, it is in principle possible to downsize the MTJ element 10 to the processing limit by setting the aspect ratio to 1. In addition, it is unnecessary to form any current magnetic field interconnections for biaxially generating current magnetic fields in different directions unlike in the in-plane magnetization type memory. Since the operation is possible when two terminals are connected to the upper and lower electrodes of the MTJ element 10, the cell area per bit can be reduced.

[5] Read Operation

A read operation of this embodiment uses the TMR effect.

The transistor Tr of a selected cell is turned on by selecting the bit line BL and word line WL corresponding to the selected cell. A read current is then supplied to the MTJ element 10 of the selected cell. The resistance value of the MTJ element 10 is read out based on this read current, and whether the recorded state is "0" or "1" is determined by an amplifying operation performed via a sense amplifier.

Note that in the read operation, it is possible to read out a current value by applying a constant voltage, or read out a voltage value by applying a constant current.

[6] Applications to Other Resistance-Change Memories

This embodiment is not limited to a magnetic random access memory, and is also effective in resistance-change memories such as a ReRAM (Resistance Random Access Memory) and PRAM (Phase-change Random Access Memory). When advancing the downsizing of cells in the ReRAM or PRAM by using this embodiment, it is possible to reduce the cost and implement a large-scale memory.

[7] Effects

In this embodiment described above, while MTJ processing including physical etching is performed using the lower electrode layer 21 as an etching stopper layer, the exposed portions of the lower electrode layer 21 are selectively oxidized, thereby electrically separating the lower electrode layer 21 into cells.

That is, in this embodiment, the lower electrode layer 21 need not be processed separately from the processing of the MTJ film 22 unlike in the above-mentioned first prior art. This obviates the need to give any design margin between the MTJ element 10 and lower electrode layer 21. Also, this embodiment eliminates the possibility of overetching because the MTJ film 22 and lower electrode layer 21 are not simultaneously processed unlike in the above-mentioned second prior art.

Accordingly, this embodiment does not use any special lithography technique on the lower electrode layer 21 while avoiding the overetching of the interlayer dielectric film 8 as an underlayer and etching damages to the lower contact layers 9. This makes it possible to implement a cell array having a very high tolerance to the misalignment of three layers, i.e., the bit line 29, MTJ element 10, and lower contact layer 9. Although the size of a lower selection device has a limit, a $4F^2$ close-packed cell can be formed by the three upper layers alone. As described above, this embodiment can implement the downsizing of cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic random access memory comprising:
a selection element formed on a semiconductor substrate;
an interlayer dielectric film formed above the selection element; a contact layer formed in the interlayer dielectric film, and electrically connected to the selection element;
a lower electrode layer made of a metal material, and electrically connected to the contact layer;
a metal oxide insulating film made of an oxide of the metal material, and surrounding a side surface of the lower electrode layer;
a magnetoresistive element formed on the lower electrode layer;
an upper electrode layer formed on the magnetoresistive element;
a sidewall insulating film formed on a side surface of the magnetoresistive element and a side surface of the upper electrode layer; and
a bit line electrically connected to the upper electrode layer,
wherein the side surface of the lower electrode layer is flush with an outer side surface of the sidewall insulating film.

2. The memory according to claim 1, wherein the lower electrode layer is made of the metal material which changes into an insulator when oxidized, and the upper electrode layer is made of a material having a high oxidation resistance.

3. The memory according to claim 1, wherein the lower electrode layer is made of the metal material which changes into an insulator when oxidized, and the upper electrode layer is made of a metal material which does not lose conductivity even when oxidized.

4. The memory according to claim 1, wherein the lower electrode layer is made of the metal material which changes into an insulator when oxidized, and the upper electrode layer is made of a metal material which changes into a semiconductor when oxidized.

5. The memory according to claim 1, wherein the lower electrode layer is made of the metal material which changes into an insulator when oxidized, and the upper electrode layer is made of a material which changes into an insulator when oxidized but is easily removable by a removing process.

6. The memory according to claim 1, further comprising a multilayered interconnection layer connected to the selection element and the contact layer.

* * * * *